US009514942B1

(12) United States Patent
Smith et al.

(10) Patent No.: US 9,514,942 B1
(45) Date of Patent: Dec. 6, 2016

(54) METHOD OF FORMING A GATE MASK FOR FABRICATING A STRUCTURE OF GATE LINES

(71) Applicant: GLOBALFOUNDRIES Inc., Grand Cayman (KY)

(72) Inventors: Elliot John Smith, Dresden (DE);
Thorsten Kammler, Dresden (DE);
Andreas Hellmich, Dresden (DE);
Carsten Grass, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/060,009

(22) Filed: Mar. 3, 2016

(51) Int. Cl.
*H01L 21/28* (2006.01)
*H01L 21/66* (2006.01)
*H01L 21/311* (2006.01)
*H01L 21/32* (2006.01)
*H01L 27/12* (2006.01)

(52) U.S. Cl.
CPC .... *H01L 21/28123* (2013.01); *H01L 21/31111* (2013.01); *H01L 21/32* (2013.01); *H01L 22/26* (2013.01); *H01L 27/1207* (2013.01)

(58) Field of Classification Search
CPC . H01L 29/785; H01L 27/1211; H01L 27/0886
See application file for complete search history.

(56) References Cited

U.S. PATENT DOCUMENTS

| 6,783,904 | B2 | 8/2004 | Strozewski et al. |
| 7,163,879 | B2 | 1/2007 | Tamura |
| 7,285,480 | B1 | 10/2007 | Joshi et al. |
| 7,393,768 | B2 | 7/2008 | Degroote |
| 7,410,840 | B2 | 8/2008 | Tigelaar |
| 7,521,760 | B2 | 4/2009 | Joshi et al. |
| 8,793,626 | B2 | 7/2014 | Parikh et al. |
| 2006/0022264 | A1 | 2/2006 | Mathew et al. |
| 2007/0090446 | A1 | 4/2007 | Tamura |
| 2013/0207228 | A1* | 8/2013 | Iida ................... H01L 21/30625 257/510 |

\* cited by examiner

*Primary Examiner* — Mohammad Choudhry
(74) *Attorney, Agent, or Firm* — Amerson Law Firm, PLLC

(57) ABSTRACT

A method of forming a gate structure over a hybrid substrate structure with topography having a bulk region and an SOI region is disclosed including forming a gate material layer above the SOI and bulk regions, forming a mask layer above the gate material layer, forming a first planarization layer above the mask layer, forming a first gate structure masking pattern above the first planarization layer, patterning the first planarization layer in alignment with the first gate structure masking pattern, and patterning the mask layer in accordance with the patterned first planarization layer, resulting in a gate mask disposed above the gate material layer.

20 Claims, 14 Drawing Sheets

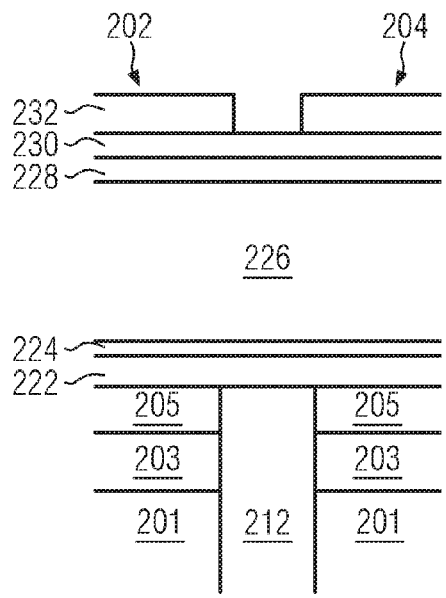
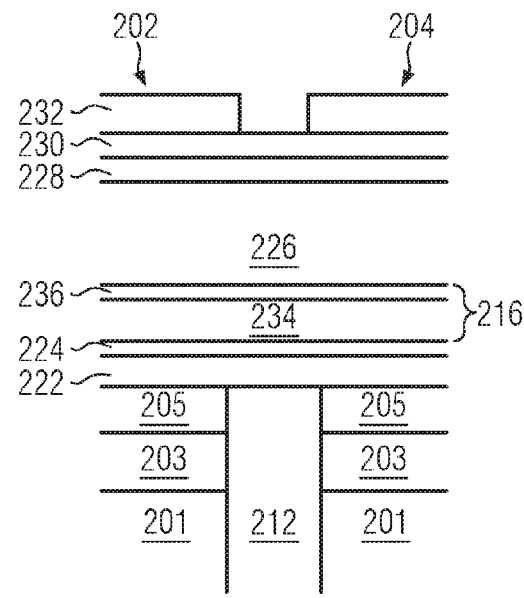
FIG. 3a          FIG. 3b
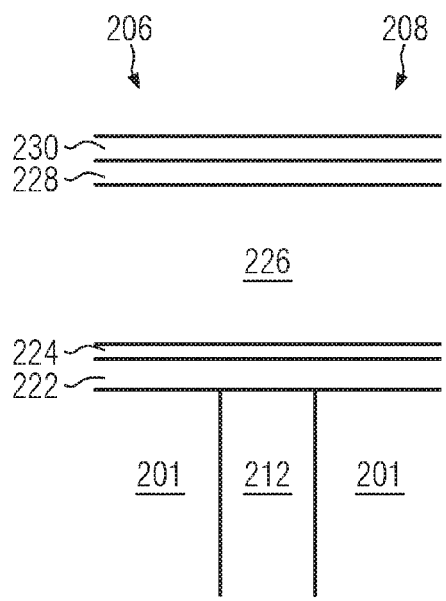
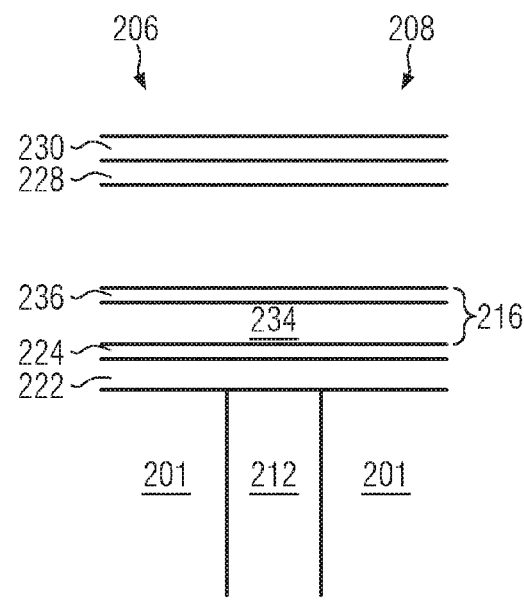
FIG. 3c          FIG. 3d

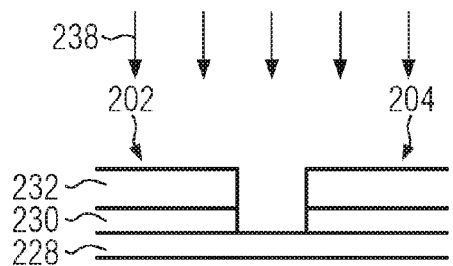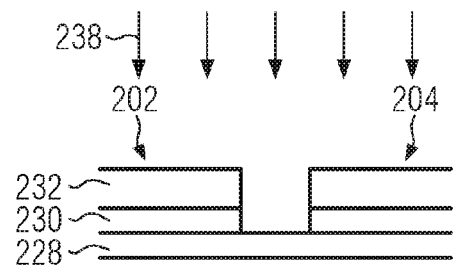
FIG. 4a  FIG. 4b
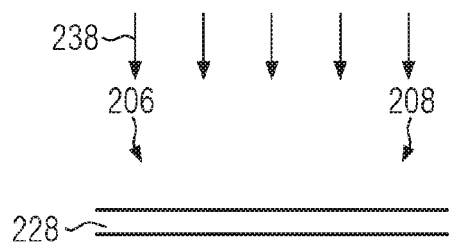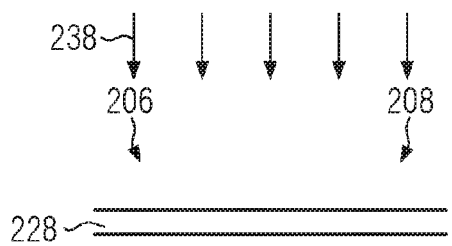
FIG. 4c  FIG. 4d

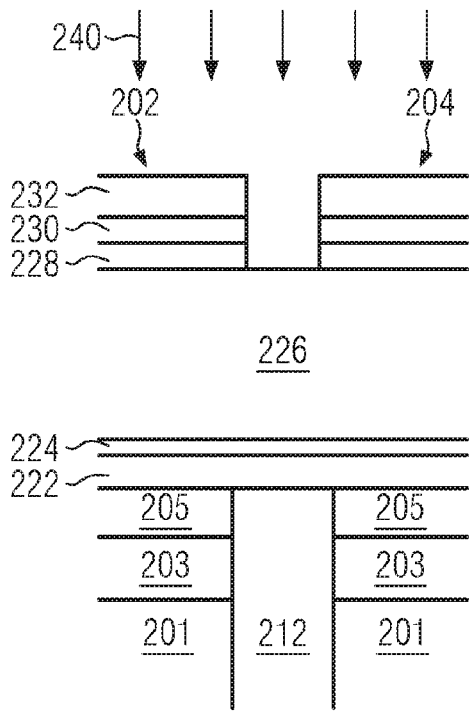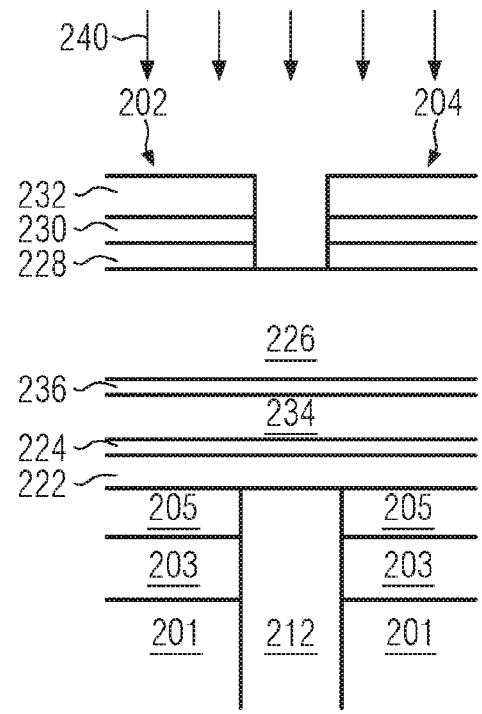
FIG. 5a  FIG. 5b
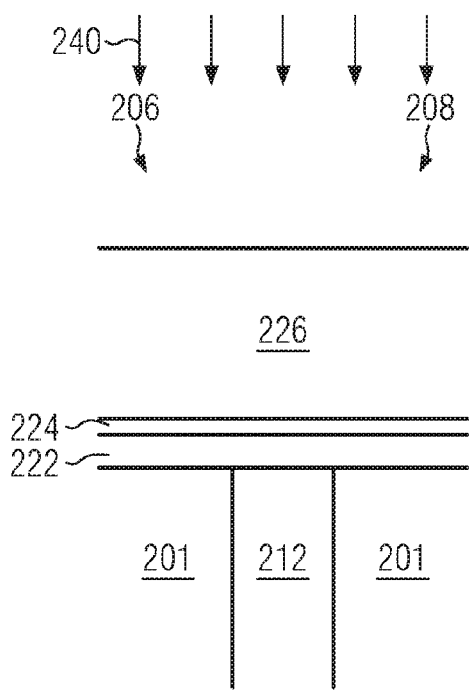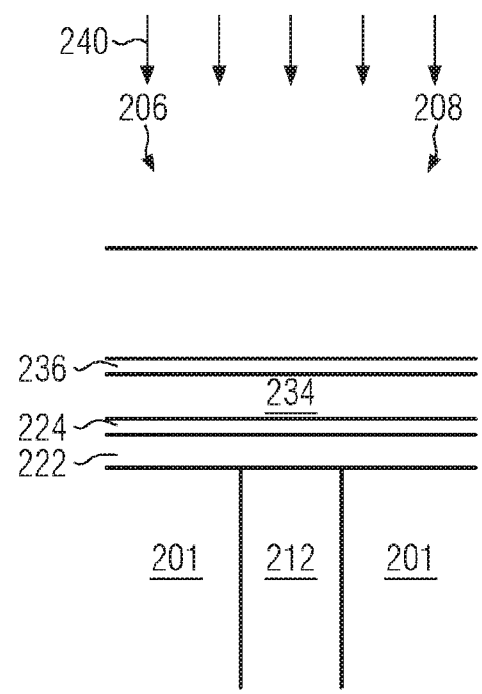
FIG. 5c  FIG. 5d

METHOD OF FORMING A GATE MASK FOR FABRICATING A STRUCTURE OF GATE LINES

BACKGROUND OF THE INVENTION

1. Field of the Invention

The present disclosure generally relates to methods of forming a gate mask for fabricating a structure of gate lines, and, more particularly, to the formation of a gate mask for fabricating a structure of gate lines in hybrid SOI/bulk techniques at advanced technology nodes.

2. Description of the Related Art

In ongoing efforts to comply with the constraints imposed by Moore's Law, fully depleted semiconductor-on-insulator (FDSOI) is currently considered as a very promising basis for next generation technologies in the fabrication of semiconductor devices at technology nodes of 22 nm and beyond. Aside from FDSOI allowing the combination of high performance and low power consumption, complemented by an excellent responsiveness to power management design techniques, the fabrication processes as employed in FDSOI techniques are comparatively simple and actually represent a low risk evolution of conventional planar bulk CMOS techniques when compared to 3-dimensional transistor designs, such as FINFETs.

In general, SOI techniques make use of a special kind of substrate conventionally formed by a silicon layer (sometimes called an active layer) formed on an oxide layer (often referred to as "buried oxide" or "BOX layer"), which is in turn formed on a bulk semiconductor substrate, such as silicon. Generally, there are two types of SOI devices: partially depleted SOI (PDSOI) devices and fully depleted SOI (FDSOI) devices. For example, in an N-type PDSOI MOSFET, a P-type film is sandwiched between a gate oxide (GOX) and the BOX, wherein a thickness of the P-type film is implemented such that the depletion region cannot cover the whole P region. Therefore, to some extent, PDSOI devices behave like bulk MOSFETs.

In FDSOI substrates, the thickness of the semiconductor or active layer is implemented such that the depletion region covers the entire thickness of the semiconductor or active layer. Herein, the BOX layer in FDSOI techniques supports fewer depletion charges than a bulk substrate and an increase in the inversion charges occurs in the fully depleted semiconductor layer, resulting in higher switching speeds for FDSOI devices when compared to PDSOI devices or bulk devices.

In recent attempts to provide a simple way of meeting power/performance targets, back biasing was suggested for FDSOI devices. When adopting the concept of back biasing, a voltage is applied to the bulk substrate just under the BOX layer of target semiconductor devices. In doing so, the electrostatic control of the semiconductor device may be changed and the threshold voltage may be shifted to either obtain more drive current (hence higher performance) at the expense of an increased leakage current (forward back bias, FBB) or to cut leakage current at the expense of reduced performance. While back bias in a planar FDSOI technique is somewhat similar to body bias as implemented in bulk CMOS technologies, it offers a number of key advantages in terms of level and efficiency of the bias that can be applied. For example, back biasing can be utilized in a dynamic way on a block by block basis. It can be used to boost performance during delimited periods of time when maximum peak performance is required from that block. It can also be used to cut leakage during the periods of time when limited performance is not an issue.

The implementation of back bias in the setup of FDSOI techniques involves a local exposure of the bulk substrate by means of a so-called bulk exposed (BULEX) region that is to be contacted. Naturally, the bulk substrate has a height difference relative to an upper surface of the semiconductor or active layer of the adjoining SOI substrate. Accordingly, a step height exists between BULEX regions and the adjacent semiconductor or active layer of the SOI substrate due to the height difference caused by the BOX layer and the semiconductor or active layer of the adjoining SOI substrate. For example, the step height may be in the range from about 20-50 nm in advanced technologies, raising big challenges in front-end-of-line (FEOL) processing of advanced semiconductor devices due to the uneven topography caused by the step height. For example, the step height between the bulk semiconductor material (at the BULEX regions) and the upper surface of the semiconductor or active layer of the adjacent SOI substrate may lead to uncontrollable variations in the critical dimensions, large offsets between critical dimensions of FDSOI and bulk structures, and, particularly, to divots and crevices in lithographical processes where film residues are hard to remove and which can cause shorts and leaks in final circuit structures.

As pointed out above, the height difference between bulk and SOI regions represents a severe issue in the fabrication of hybrid structures employing SOI substrate portions and bulk portions, e.g., in the form of BULEX regions. Conventionally, this issue is addressed by re-growing silicon material on BULEX regions (i.e., the bulk silicon material) within FDSOI techniques for leveling the bulk regions and the SOI regions when forming gate structures. Accordingly, after the formation of BULEX regions, a wafer is planarized by re-growing semiconductor material (e.g., silicon) on the BULEX regions prior to forming gate structures. However, the re-growth of such semiconductor material introduces dislocations at the border between BULEX and SOI regions due to a misalignment of the height level between the re-grown semiconductor material and adjacent SOI regions caused by process tolerances. These dislocations are usually removed when forming shallow trench isolation (STI) structures between BULEX and SOI regions upon recessing the substrate material at the border between the BULEX regions and the SOI regions and filling of the recesses by STI material. However, this approach requires a rather large separation between BULEX and SOI regions because STI structures of a sufficient size to compensate for the dislocations have to be formed.

In view of the above discussion of the related art, it is, therefore, desirable to provide a process flow in hybrid bulk/SOI techniques to address patterning difficulties occurring due to the high topography in gate modules and/or avoiding issues raised in the hybrid techniques as pointed out above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In a first aspect of the present disclosure, a method of forming a gate structure over a hybrid substrate structure with topography having a bulk region and an SOI region is provided. In accordance with some illustrative embodiments herein, the method includes forming a gate material layer over the SOI and bulk regions, forming a mask layer over the gate material layer, forming a first planarization layer over the mask layer, forming a first gate structure masking pattern over the first planarization layer, patterning the first planarization layer in alignment with the first gate structure masking pattern, and patterning the mask layer in accordance with the patterned first planarization layer, resulting in a gate mask disposed above the gate material layer. Herein, patterning the first planarization layer includes applying a first etching process to the first planarization layer, wherein the first etching process removes the first planarization layer over the SOI region so as to expose the mask layer over the SOI region while leaving the mask layer over the bulk region covered by remaining first planarization layer material over the bulk region, and applying a second etching process that removes the remaining first planarization layer material over the bulk region and exposes the mask layer over the SOI region.

In a second aspect of the present disclosure, a method of forming a gate structure over a hybrid substrate structure with topography having a bulk region and an SOI region is provided. In accordance with some illustrative embodiments of the present disclosure, the method includes forming a gate material layer over the SOI and bulk regions, forming a mask layer over the gate material layer, forming a first planarization layer over the mask layer, forming a first gate structure masking pattern over the first planarization layer, patterning the first planarization layer in alignment with the first gate structure masking pattern, and patterning the mask layer in accordance with the patterned first planarization layer, resulting in a gate mask disposed above the gate material layer, forming a second planarization layer over the gate mask disposed over the SOI and bulk regions, forming a second gate structure masking pattern over the planarization layer, the second gate structure masking pattern being at least formed over the SOI region, patterning the second planarization layer in alignment with the second gate structure masking pattern, and patterning the gate mask in alignment with the patterned second planarization layer.

BRIEF DESCRIPTION OF THE DRAWINGS

The disclosure may be understood by reference to the following description taken in conjunction with the accompanying drawings, in which like reference numerals identify like elements, and in which:

FIGS. 3a-3d schematically illustrate, in cross-sectional views along respective ones of the lines a-a, b-b, c-c and d-d in FIG. 2, an early stage during fabrication, after the process flow as described above with regard to FIGS. 1a-1i is completed;

FIGS. 4a-4d schematically illustrate, in cross-sectional views, the fabrication at a more advanced stage in accordance with some illustrative embodiments of the present disclosure;

FIGS. 5a-5d schematically illustrate, in cross-sectional views, the fabrication at a more advanced stage during fabrication;

Figure 1A:
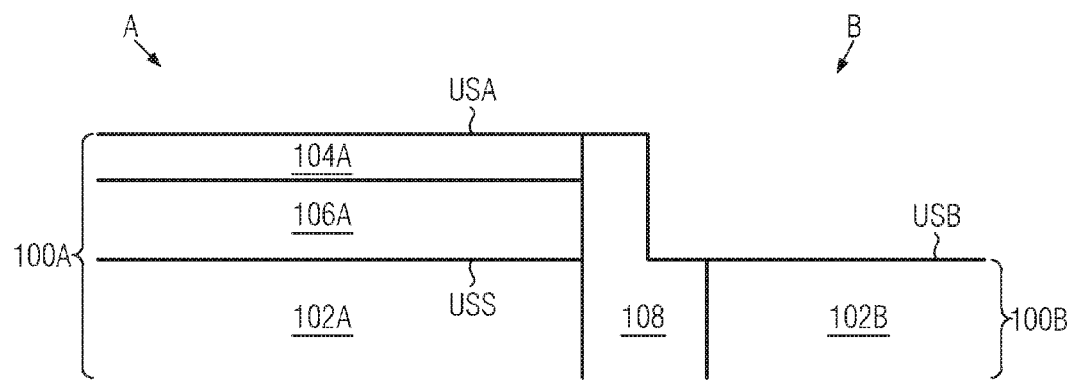
FIGS. 1a-1i schematically illustrate, in cross-sectional views, a process of forming a gate mask for fabricating a structure of gate lines in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase. For example, the person skilled in the art will appreciate after a complete reading of the present disclosure that the expression "A over B" is not limited to the understanding that A is directly disposed on B, i.e., A and B being in physical contact.

The present disclosure shows, in accordance with some illustrative embodiments of the present disclosure, the fabrication of semiconductor device structures, such as a plurality of MOSFET or MOS devices integrated on a chip. When referring to MOS devices, the person skilled in the art will appreciate that, although the expression "MOS device" is used, no limitation to a metal-containing gate material and/or to an oxide-containing gate dielectric material is intended. Accordingly, a semiconductor device structure may be understood as comprising at least two MOS devices of at least one of a P-type and an N-type.

Semiconductor devices of the present disclosure may concern devices which may be fabricated by using advanced technologies, i.e., the semiconductor devices may be fabricated by technologies applied to approach technology nodes smaller than 100 nm, for example, smaller than 50 nm or smaller than 35 nm, e.g., at 22 nm or below. After a complete reading of the present application, a person skilled in the art will appreciate that, according to the present disclosure, ground rules smaller or equal to 45 nm, e.g., at 22 nm or below, may be imposed. The present disclosure proposes semiconductor devices that may have structures of minimal length dimensions and/or width dimensions smaller than 100 nm, for example, smaller than 50 nm or smaller than 35 nm or smaller than 22 nm. For example, the present disclosure may provide semiconductor devices fabricated by using 45 nm technologies or below, e.g., 22 nm or even below.

After a complete reading of the present application, a person skilled in the art will appreciate that semiconductor devices disclosed herein may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

Furthermore, semiconductor devices may be formed as bulk devices and/or SOI (semiconductor-on-insulator) devices. The expression SOI is not intended as being limited to a special technique. In general, SOI devices may have an active semiconductor layer disposed on a buried insulating material layer, which, in turn, may be formed on a base or bulk substrate material. In accordance with some illustrative embodiments of the present disclosure, the active semiconductor layer may comprise one of silicon, germanium, silicon germanium and the like. The buried insulating material layer may comprise an insulating material, e.g., silicon oxide or silicon nitride. The bulk substrate material may be a base material that may be used as a substrate as known in the art, e.g., silicon and the like.

In accordance with at least some of the herein disclosed illustrative embodiments employing FDSOI substrates, the active semiconductor layer may have a thickness of about 20 nm or less, while the buried insulating material layer may have a thickness of about 145 nm or, in accordance with advanced techniques, the buried insulating material layer may have a thickness in a range from about 10-30 nm. For example, in some special illustrative embodiments of the present disclosure, the active semiconductor layer may have a thickness of about 3-10 nm.

As to a crystalline plane orientation of the base substrate material, similar to that of an ordinary silicon device, an SOI substrate having a surface with a face (100) may be used. However, in order to improve the performance of a PMOS semiconductor device, a surface of the PMOS semiconductor device may be used as a face (110). Alternatively, a hybrid plane orientation substrate whose surface may be mixed by a face (100) and a face (110) may be used. In alternative embodiments, the base substrate material may be of an N-type when N-accumulation and/or N-inversion devices are considered (otherwise P-type for P-accumulation and/or P-inversion).

After a complete reading of the present disclosure, the person skilled in the art will appreciate that usage of the expression "semiconductor device structure" may relate to at least a first semiconductor device comprising a first gate structure formed over a first active region of a substrate, and a second semiconductor device comprising a second gate structure formed over a second active region of the substrate. Furthermore, the person skilled in the art will appreciate that a semiconductor device structure may comprise at least two adjoining semiconductor devices or, alternatively, at least two semiconductor devices of a semiconductor device structure may be laterally separated by at least one isolation structure, such as a shallow trench isolation and the like formed in the substrate.

With regard to FIGS. 1a-1i, some illustrative embodiments of present disclosure will be explained in greater detail below.

FIG. 1a schematically illustrates, in a cross-sectional view, a hybrid substrate configuration comprising a first active region A and a second active region B. The first active region A and the second active region B may be separated by a trench isolation structure 108, such as a shallow trench isolation (STI), a deep trench isolation and the like. The first active region A may be formed by an SOI substrate portion 100A, the SOI substrate portion 100A comprising a semiconductor substrate 102A over which an active semiconductor layer portion 104A may be formed. A buried insulating material portion 106A may be interposed between the semiconductor substrate 102A and the active semiconductor layer portion 104A. Accordingly, an upper surface USA of the active semiconductor layer portion 104A may be exposed to further processing, while an upper surface portion USS of the semiconductor substrate 102A may be covered by the buried insulating material portion 106A. The second active region B may be formed by a bulk substrate portion 100B, the bulk substrate portion 100B comprising a semiconductor substrate 102B, an upper surface USB of which may be exposed to further processing.

After a complete reading of the present disclosure, the person skilled in the art will appreciate that the first active region A may correspond to "an SOI region" as referred to above with regard to the first and second aspects of the present disclosure, while the second active region B may correspond to "a bulk region" as referred to above regarding the first and second aspects of the present disclosure. Herein, the hybrid substrate may comprise at least one SOI region and/or at least one bulk region, at least one of the SOI regions being separated from at least one bulk region by at least one further SOI and/or bulk region.

In accordance with some illustrative embodiments of the present disclosure, the active semiconductor layer portion 104A may comprise a semiconductor material, such as silicon, germanium, silicon germanium and the like. The buried insulating material portion 106A may be a buried oxide material (e.g., BOX), a buried nitride material and the like. The substrate material 102A may be formed by a known bulk substrate, such as a silicon bulk substrate, a germanium bulk substrate, a silicon germanium bulk substrate and the like.

In accordance with some illustrative embodiments of the present disclosure, the semiconductor substrate 102B may be provided by a known bulk substrate, such as a silicon bulk substrate, a germanium bulk substrate, a silicon germanium bulk substrate and the like.

In accordance with some illustrative embodiments of the present disclosure, the semiconductor substrate 102A and the semiconductor substrate 102B may be provided by the same bulk substrate material, that is, the semiconductor substrate 102A and the semiconductor substrate 102B may represent upper surface portions of a common bulk substrate, which upper surface portions are separated by the trench isolation structure 108.

In accordance with some illustrative embodiments of the present disclosure, the trench isolation structure 108 may be formed in accordance with known STI forming techniques and may comprise an insulating material, such as an oxide material, a nitride material and the like.

In accordance with some illustrative embodiments of the present disclosure, the hybrid substrate configuration, as depicted in FIG. 1a, may be prepared by providing an SOI substrate (not illustrated), forming at least one trench isolation structure in the SOI substrate, e.g., at least the trench isolation structure 108, as depicted in FIG. 1a, and partially exposing an upper surface USB of the semiconductor substrate 102A by partially removing the active semiconductor layer and the buried insulating material layer. The person skilled in the art will appreciate that an SOI substrate may be prepared in accordance with known techniques, such as SIMOX ("separation by implanted oxygen") techniques, smart cut techniques and the like.

In accordance with some illustrative embodiments of the present disclosure, the active semiconductor layer portion 104A may be subjected to doping so as to form, for example, an active layer 104A comprised of silicon-germanium, in the case where PMOS devices or device structures are to be formed in and above the first active region A.

In accordance with some illustrative embodiments of the present disclosure, an optional implantation process (not illustrated) may be performed for implanting dopants into at least one of the first active region A and the second active region B. In accordance with some special illustrative examples, the implantation process (not illustrated) may comprise a well implantation process (not illustrated) for forming a well region (not illustrated) in the semiconductor substrate 102B. Additionally, or alternatively, a SiGe doping may be performed in the semiconductor substrate 102B in accordance with known techniques.

In accordance with some illustrative embodiments of the present disclosure, a semiconductor device structure comprising at least one of a DCAP, a varactor or a MOSFET may be formed in and above the second active region B. Alternatively or additionally, the second active region B may be used for implementing a back bias to semiconductor devices to be formed in and above the first active region A.

Figure 1B:
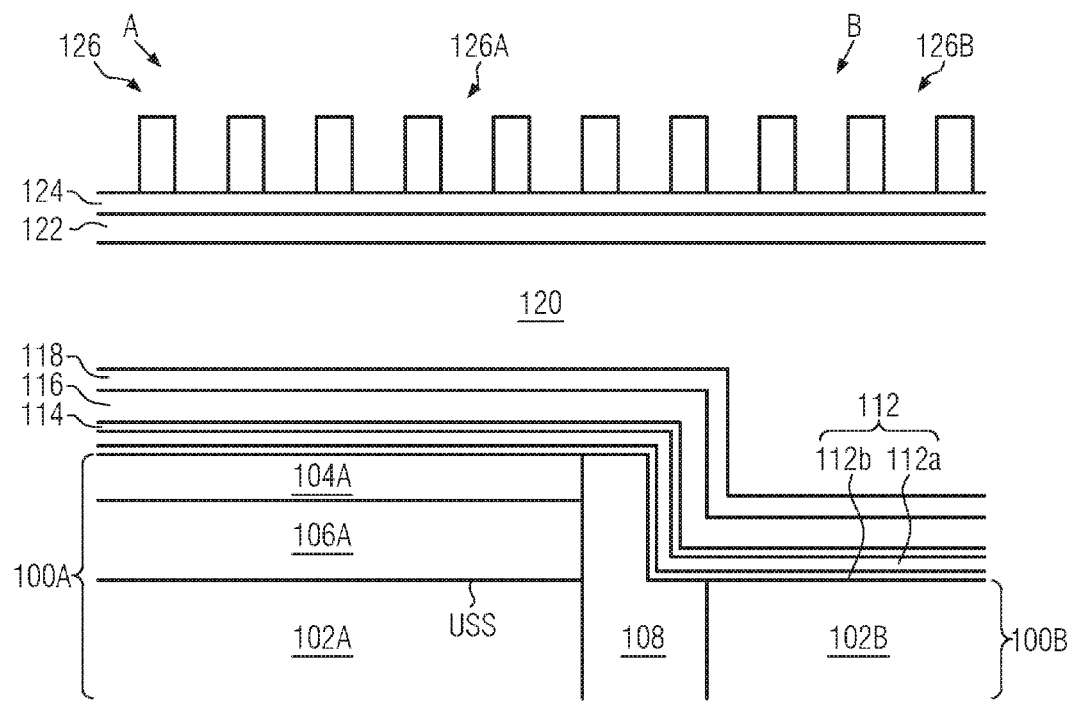

FIG. 1b schematically illustrates an early stage during a process of forming a gate mask for fabricating a structure of gate lines, after a gate material layer 112 and an insulating material 114 are formed over the first and second active regions A and B. In accordance with some illustrative embodiments of the present disclosure, the gate material layer 112 may comprise a gate stack configuration having a gate electrode material 112a, such as polysilicon, amorphous silicon or a gate metal, and a gate dielectric material 112b, such as a gate oxide material, such as silicon oxide, and/or a high-k material, and the like. For illustrative convenience, the gate electrode material 112a and the gate dielectric material 112b will be omitted in the following figures.

In accordance with some illustrative embodiments of the present disclosure, a mask layer 116 may be formed over the insulating material 114. In accordance with some illustrative embodiments of the present disclosure, the mask layer 116 may be a hard mask layer. The mask layer 116 may be provided by depositing an insulating material, such as a nitride material or an oxide material. In accordance with a special illustrative example herein, the masked layer 116 may comprise silicon nitride.

With regard to FIG. 1b, an optional further mask layer 118 may be formed on the mask layer 116, the further mask layer 118 comprising an oxide material or a nitride material different from the insulating material forming the mask layer 116. Regarding the further mask layer 118, the person skilled in the art will appreciate that no limitation of the present disclosure is intended and the further mask layer 118 may be omitted, i.e., the further mask layer 118 is optional in the process flow as described below with regard to the following figures.

In accordance with some illustrative embodiments of the present disclosure, an planarization layer 120, e.g., an organic planarization layer (OPL), may be subsequently deposited over the mask layer 116. In accordance with some special illustrative examples herein, the planarization layer 120 may be formed by coating the hybrid substrate configuration with H—SOH. Alternatively, the planarization layer 120 may be formed by spin-on carbon (SOC). Subsequently, a hard mask layer 122 may be formed on the planarization layer 120, followed by a bottom anti-reflective coating (BARC) layer 124, e.g., a silicon rich BARC or Si BARC, and a first gate structure masking pattern 126, e.g., implemented via a patterned photoresist. In accordance with some illustrative examples herein, the hard mask layer 122 may be provided by a low temperature oxide (TO), a nitride material, a silicon oxynitride material, and the like.

In accordance with some illustrative embodiments of the present disclosure, a thickness of the gate material layer 112 may be in a range from about 15-50 nm, e.g., in a range from about 20-35 nm, such as at about 25 nm. In accordance with some illustrative embodiments of the present disclosure, a thickness of the mask layer 116 may be in a range from about 20-50 nm, such as at about 40 nm. In accordance with some illustrative embodiments of the present disclosure, the further mask layer 118 may have a thickness in a range from about 10-30 nm, such as at about 20 nm. In accordance with some illustrative embodiments of the present disclosure, a thickness of the planarization layer 120 may be in a range of about 100-270 nm, such as in a range from about 130-150 nm, e.g., at about 140 nm. In accordance with some illustrative embodiments of the present disclosure, the hard mask layer 122 may have a thickness in a range from about 20-40 nm, such as at about 30 nm. In accordance with some illustrative embodiments of the present disclosure, the BARC layer 124 may have a thickness in a range from about 10-40 nm, such as at about 25 nm. In accordance with some illustrative embodiments of the present disclosure, the first gate structure masking pattern 126 may have a thickness in a range from about 50-150 nm, such as from about 90-100 nm, e.g., at about 96 nm.

In accordance with some illustrative embodiments of the present disclosure, the first gate structure masking pattern 126 may comprise a plurality of gate mask strips 126A formed over the first active region A, and a plurality of gate mask strips 126B formed over the second active region B. The gate mask strips 126A may correspond to gate lines to be formed over the first active region A. The gate mask strips 126B may correspond to gate lines or dummy gate lines to be formed over the second active region B. This does not pose any limitation on the present disclosure and the person skilled in the art will appreciate that the plurality of gate mask strips 126B may be omitted over the second active region B.

Figure 1C:
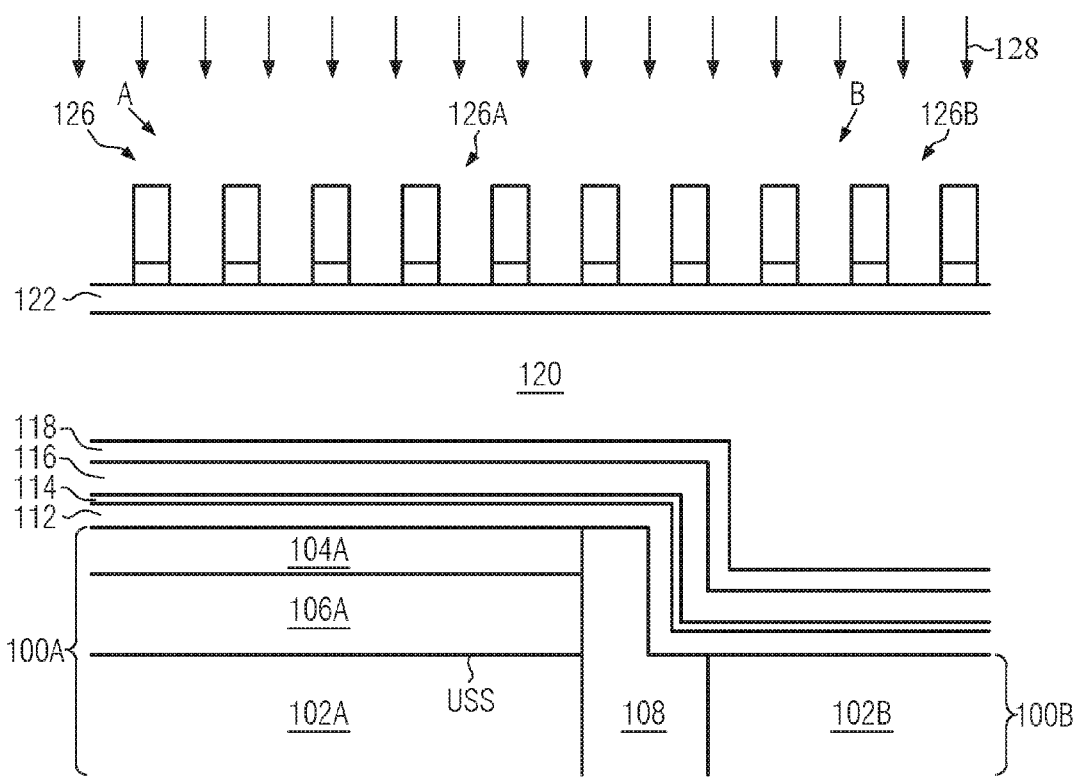

FIG. 1c schematically illustrates the process at a more advanced stage during a BARC etch 128 in which the BARC layer 124 may be etched in alignment with the first gate structure masking pattern 126. Accordingly, the first gate structure masking pattern 126 may be transferred into the BARC layer 124.

Figure 1D:
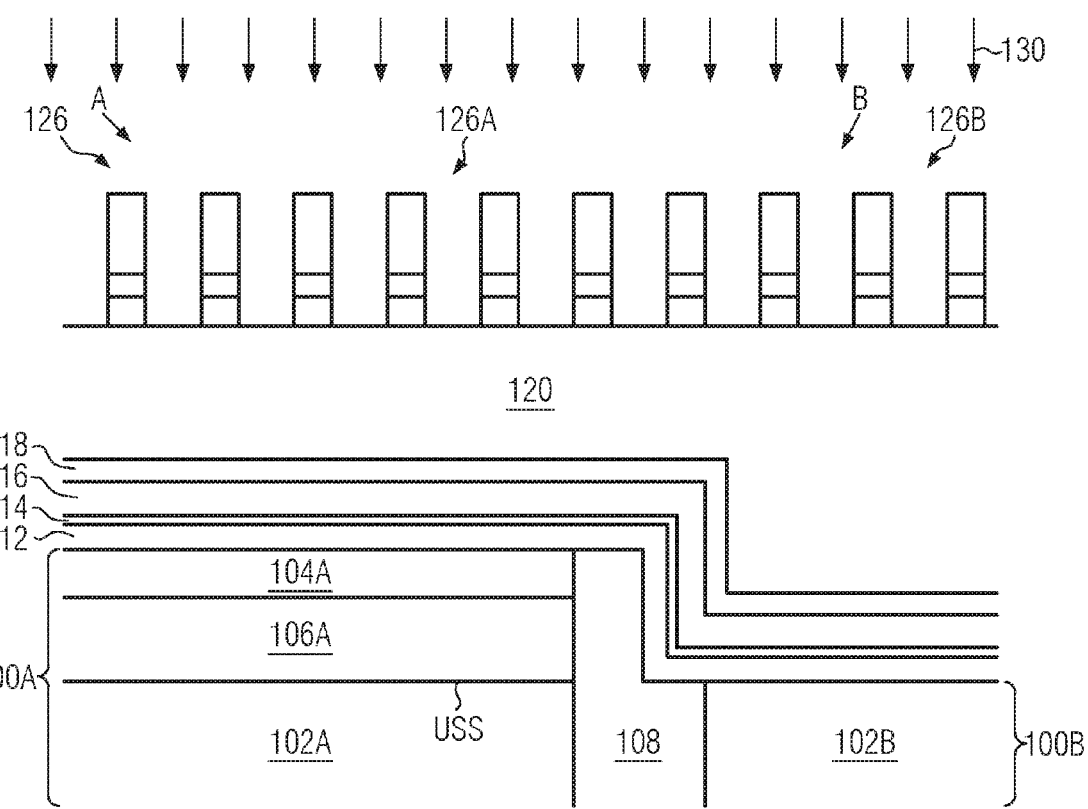

FIG. 1d schematically illustrates the process flow at a more advanced stage during an etching process 130. The etching process 130 may be performed in order to transfer the first gate structure masking pattern 126 into the hard mask layer 122. In accordance with some illustrative embodiments of the present disclosure, the etching process 130 may be an etching process with end point detection to terminate on the planarization layer 120.

Accordingly, the first gate structure masking pattern 126 may be transferred into the hard mask layer 122.

Figure 1E:
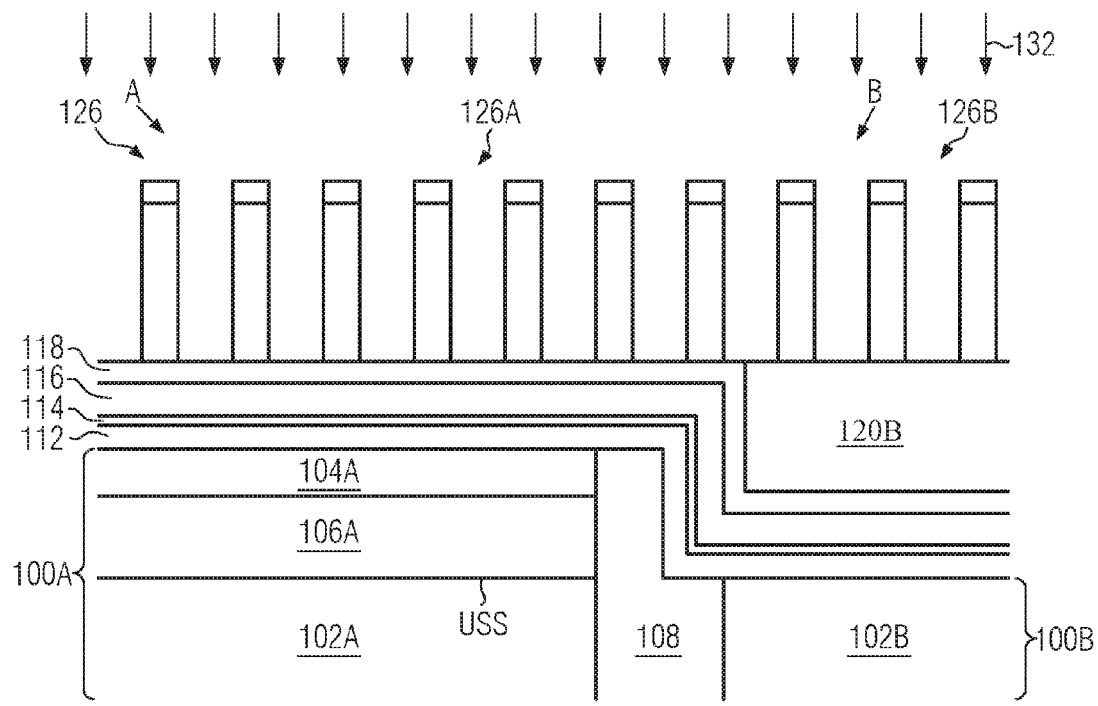

FIG. 1e schematically illustrates the process flow at a more advanced stage, when an etching process 132 is performed. In accordance with some illustrative embodiments of the present disclosure, the etching process 132 may comprise an etchant for etching the planarization layer 120 over the first active region A with end point detection on the further mask layer 118. The person skilled in the art will appreciate that, alternatively, the further mask layer 118 may be omitted and the etching process 132 may be configured to end on the mask layer 116 or may be ended on the mask layer 116 over the first active region. Due to the topography between the first active region A and the second active region B as depicted in FIG. 1a, a remaining planarization layer material 120B is present over the second active region B. Therefore, the person skilled in the art will appreciate that the etching process 132 completely removes the planarization layer 120 (see FIG. 1d) over the first active region A, while leaving remaining planarization layer material 120B over the second active region B, i.e., the etching process 132 may only partially remove the planarization layer 120 over the second active region B.

In accordance with some illustrative embodiments of the present disclosure, the patterned photoresist (see FIG. 1b), and the remaining BARC material may be removed in the etching process 132.

Figure if schematically illustrates the process flow at a more advanced stage, when an etching process 134 is performed. In accordance with some illustrative embodiments of the present disclosure, the etching process 134 may be performed to remove the remaining planarization layer material 120B over the second active region B via a highly anisotropic etchant that may be selective to the material of the further mask layer 118 and/or the mask layer 116 (in case that no further mask layer 118 is present, the etchant may be highly selective to the material of the mask layer 116). Accordingly, the first gate structure masking pattern 126 may be transferred into the planarization layer 120 via the etching processes 132 and 134.

Figure 1F:
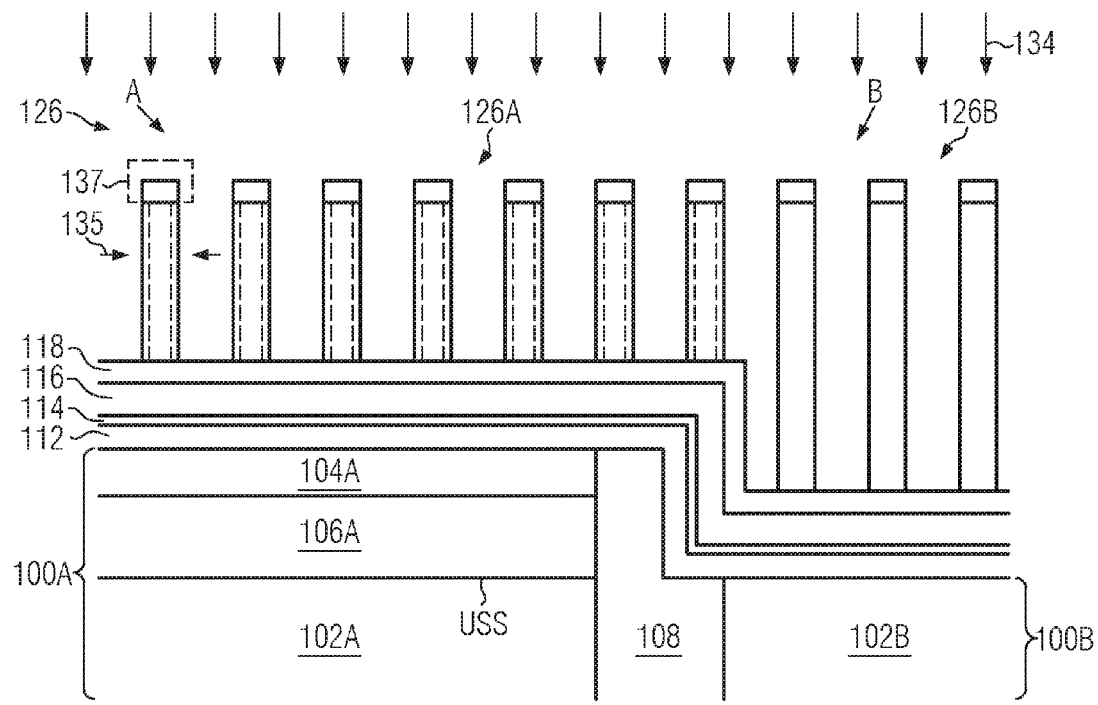

In accordance with some illustrative embodiments of the present disclosure, the etching process 134 may comprise an etchant that may laterally act on the plurality of gate mask strips 126A over the first active region A as indicated via the arrow 135 and the broken line in Figure if (possibly due to the lack of remaining planarization layer material over the first active region A). Accordingly, the first gate structure mask pattern 126 may be affected by the etching process 134, that is, the first gate structure mask pattern 126 may be laterally etched over the first active region A when removing the remaining planarization layer 120B over the second active region B, i.e., a pinching of minimal gate lines over the first active region A may occur, as schematically illustrated in FIG. 1f. In order to circumvent this possible lateral etching 135, the first gate structure masking pattern 126 over the first active region A may be upscaled (or increased size) over the first active region A as compared to the second active region B (see the broken line 137 in FIG. 1f) so as to compensate for the lateral etching 135. After a complete reading of the present disclosure, the person skilled in the art will appreciate that, when forming the first gate structure masking pattern 126 at the stage illustrated in FIG. 1b, the first gate structure masking pattern 126 may be formed to comprise at least one first masking feature over the first active region A, e.g., at least one of the gate mask strips 126A, and at least one second masking feature over the second active region, e.g., at least one of the gate mask strips 126B, wherein a width of the at least one first masking feature is greater than a width of the at least one second masking feature. In accordance with some illustrative examples herein, the width of the at least one first masking feature may be set based on a width of the at least one second masking feature and a lateral etching rate of the second etching process. Accordingly, a possible unwanted lateral etching of the gate mask strips 126A over the first active region A may be compensated.

Figure 1G:
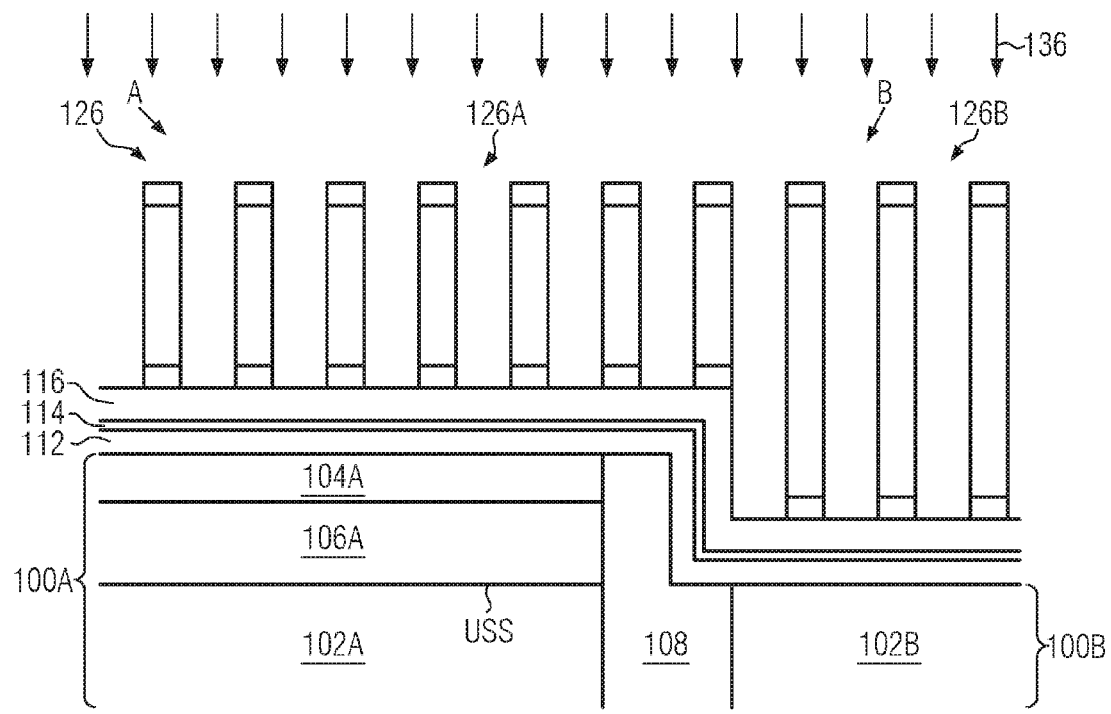

FIG. 1g schematically illustrates the process flow at a more advanced stage, when an optional etching process 136 is performed. The optional etching process 136 may be performed in order to transfer the first gate structure masking pattern 126 into the further mask layer 118 over the first and second active regions A and B. In accordance with some illustrative embodiments, the optional etching process 136 may comprise an oxide etchant, provided that the further mask layer 118 is formed by an oxide material.

Figure 1H:
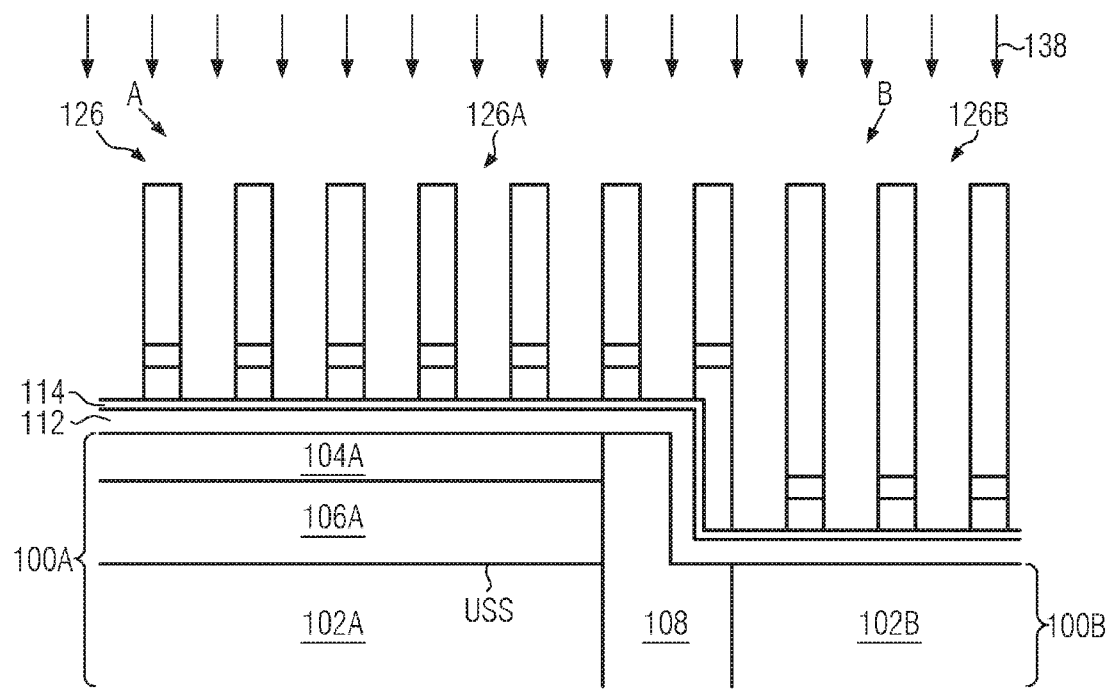

FIG. 1h schematically illustrates the process flow at a more advanced stage, when an etching process 138 is performed. In accordance with some illustrative embodiments of the present disclosure, the etching process 138 may selectively etch the mask layer 116 with regard to the material layers 114 and/or 112 below. Accordingly, the first gate structure masking pattern 126 may be transferred into the mask layer 116.

Figure 1I:
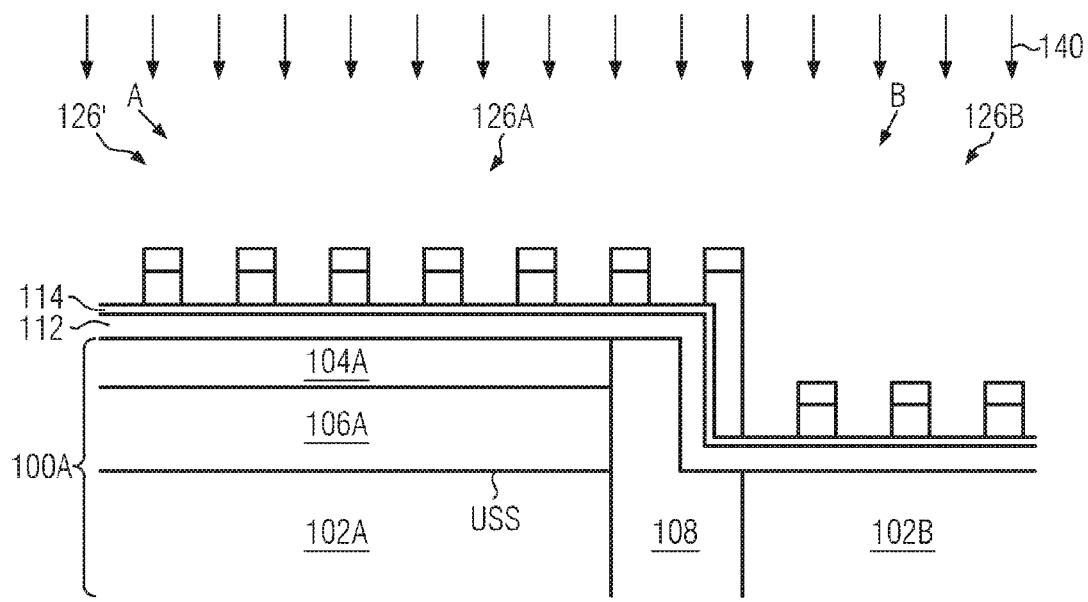

FIG. 1i schematically illustrates the process flow at a more advanced stage during fabrication, when a process 140 is performed in order to remove the remaining planarization layer material over the first and second active regions A and B. Accordingly, a gate mask 126' may be formed over the gate material layer 112.

In accordance with some illustrative embodiments of the present disclosure, as described above, issues with re-grown material on BULEX regions as discussed above with regard to the prior art may be avoided and a smaller separation between the first and second active regions A and B may be implemented. After a complete reading of the present disclosure, the person skilled in the art will appreciate that the gate material layer 112 over at least one of the first and second active regions A and B may be patterned due to the gate mask 126' herein despite a high topography, wherein the etching process 134 (FIG. 1f) allows to reliably remove the remaining planarization layer material 120B over the second active region B despite the high topography.

In accordance with some illustrative embodiments of the present disclosure, the process may be continued by anisotropically etching the gate material layer 112 in accordance with the gate mask 126' for forming gate lines (not illustrated) over the first and/or second active regions A, B, followed by the formation of source/drain regions in accordance with the formed gate lines.

In accordance with some illustrative embodiments of the present disclosure, the gate mask 126' may be further patterned as described below.

Figure 2:
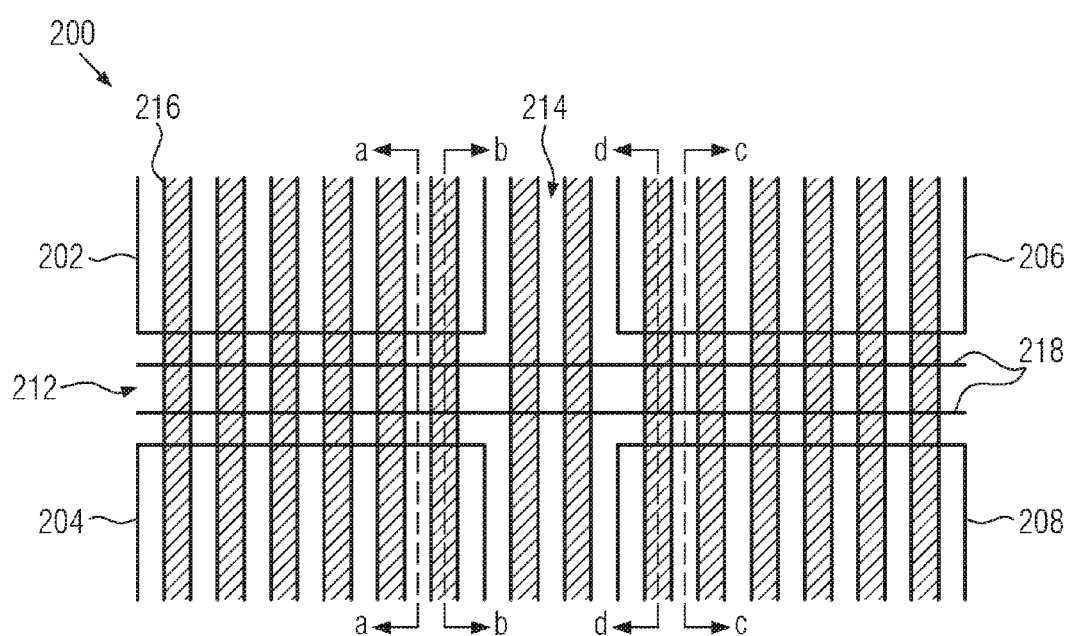
FIG. 2 schematically illustrates, in a top view, a hybrid SOI/bulk substrate in accordance with some illustrative embodiments of the present disclosure.

FIG. 2 schematically illustrates, in a top view, an arrangement of two adjacent active regions 202 and 204 of the SOI type (similar to the first active region A as described above), and two active regions 206 and 208 of a bulk configuration (similar to the second active region B as described above). The person skilled in the art will understand that the schematic illustration in FIG. 2 does not depict any gate material corresponding to the gate material layer 112 in FIGS. 1a-1i for not obscuring a top view on the active regions 202, 204, 206 and 208.

As depicted in FIG. 2, the active regions 202 and 204 may be separated by a trench isolation structure 212. The trench isolation structure 212 may further separate the active regions 206 and 208. Furthermore, the active regions 202 and 206 may be laterally separated by a trench isolation structure 214, which may separate the active region 204 and the active region 208. Although a cross-type trench isolation structure 212, 214 is depicted in FIG. 2, this does not pose any limitation on the present disclosure and the person skilled in the art will appreciate that any other geometrical shape of the trench isolation structures 212 and 214 may be considered in order to separate the active regions 202, 204, 206 and 208.

FIG. 2 further depicts a gate mask 216 corresponding to the gate mask 126' in FIG. 1i. The person skilled in the art will appreciate that, after applying a gate etch process to the configuration as schematically illustrated in FIG. 1i, gate lines corresponding to the gate mask 216 overlying the active regions may be formed. Accordingly, gate lines may be formed over the first and second active regions A and B in FIG. 1i similar to the strips 216 in FIG. 2. However, this does not pose any limitation to the present disclosure, and the person skilled in the art will appreciate that, for example, gate lines may be only formed over the active regions 202 and 204 in FIG. 2. Accordingly, a further patterning of the gate mask 216 may be desirable to eliminate any dummy gate outside the active regions 202 and 204. Additionally, or alternatively, it may be desirable to electrically separate at least some of the gate lines over the active regions 202 and/or 206 from gate lines extending over the active region 204 and/or 208. This may be achieved via a patterned gate mask having a cut, as indicated by lines 218 in FIG. 2.

With regard to the FIGS. 3-10 below, a process flow for patterning the gate mask 216 (possibly obtained by a process as described above with regard to FIGS. 1a-1i) will be described.

FIG. 3a schematically illustrates, in a cross-sectional view along the line a-a in FIG. 2, the configuration of the active region 202 and the active region 204 at a stage during processing, after the mask pattern 216 (possibly corresponding to the mask pattern 126' in FIG. 1i) may be formed and a gate material layer 222 (possibly similar to the gate material layer 112 in FIGS. 1a-1i) may be formed. Each of the active regions 202 and 204 may have an SOI configuration similar to the substrate 100A as described above with regard to FIG. 1a. That is, an active semiconductor layer portion 205 may be formed over a semiconductor substrate 201 having a buried insulating material portion 203 interposed therebetween.

In accordance with some illustrative embodiments, as depicted in FIG. 3a, an insulating material 224 may be formed over the gate material layer 222. The insulating material 224 may comprise one of an oxide material and a nitride material.

In accordance with the stage as illustrated in FIG. 3a, a planarization layer 226 may be formed over the gate material layer 222 (by a similar process as used to deposit the planarization layer 120 over the gate material layer 112 in FIG. 1b).

In accordance with some illustrative embodiments as depicted in FIG. 3a, a hard mask layer 228 (possibly similar to the hard mask layer 122), a BARC layer 230 (possibly similar to the BARC layer 124), and a second gate structure masking pattern 232 (possibly corresponding to a mask as schematically indicated via the lines 218 in FIG. 2) may be formed over the active regions 202, 204 and the trench isolation structure 212 as depicted in FIG. 3a.

FIG. 3b schematically illustrates a cross-sectional view along the line b-b in FIG. 2. As it is visible from FIG. 2, the cross-section as depicted in FIG. 3b runs along a strip of the gate mask 216, wherein the gate mask 216 comprises a mask layer 234 and an optional further mask layer 236 (possibly similar to the mask layer 116 and the optional further mask layer 118).

FIG. 3c schematically illustrates a cross-sectional view along the line c-c in FIG. 2. Herein, the gate material layer 222, the planarization layer 226, the hard mask layer 228 and the BARC layer 230 may be formed over the active regions 206 and 208 having a bulk configuration according to which the gate material layer 222 may be formed on an upper surface of the semiconductor substrate 201.

FIG. 3d schematically illustrates a cross-sectional view along the line d-d in FIG. 2. Herein, it is visible that the cross-section, as depicted in FIG. 3d, comprises a strip of the gate mask 216 similar to the gate mask 216 depicted in FIG. 3b.

According to the illustration in FIGS. 3a-3d, the second gate structure masking pattern does not cover the BARC layer 230 over any of the active regions 206 and 208. Accordingly, the gate material 222 may be removed from above the active regions 206 and 208 in addition to the cut 218 in FIG. 2. This does not pose any limitation on the present disclosure and the person skilled in the art will appreciate that, in case that gate lines are to be formed over the active regions 206 and 208 similar to the active regions 202 and 204, an according second gate structure masking pattern, as depicted in FIGS. 3a and 3b, would be formed over the BARC layer in FIGS. 3c and 3d.

FIG. 4a schematically illustrates the cross-sectional view along the line a-a in FIG. 2 at a more advanced stage during fabrication, when an etching process 238 is performed. In accordance with some illustrative embodiments of the present disclosure, the etching process 238 may transfer the second gate structure masking pattern 232 into the BARC layer 230 over the active regions 202 and 204 and the trench isolation structure 212.

Similarly, the second gate structure masking pattern 232 may be transferred into the BARC layer 230 over the gate mask as depicted in the cross-sectional view of FIG. 4b.

With regard to FIGS. 4c and 4d, the BARC layer 230 may be removed from above the active regions 206 and 208 and from above the trench isolation structure 212 between the active regions 206 and 208.

With regard to FIGS. 5a to 5d, respective cross-sectional views along the lines a-a, b-b, c-c and d-d in FIG. 2 are schematically illustrated at a more advanced stage during fabrication, when an etching process 240 is performed. According to the etching process 240, the second gate structure masking pattern 232 may be transferred into the hard mask layer 228 over the active regions 202 and 204 and over the trench isolation structure 212 between the active regions 202 and 204 (FIGS. 5a and 5b), while the hard mask layer 228 is removed from above the active regions 206 and 208 and from over the trench isolation 212 between the active regions 206 and 208 (FIGS. 5c and 5d). That is, the planarization layer 226 may be exposed over the active regions 206 and 208 and over the trench isolation structure 212 between the active regions 206 and 208 (FIGS. 5c and 5d). On the other hand, the planarization layer 226 may be partially exposed in alignment with the second gate structure masking pattern 232 via the etching process 240 over the active regions 202 and 204 and over the trench isolation structure 212 between the active regions 202 and 204 (FIGS. 5a and 5b).

Figure 6A:
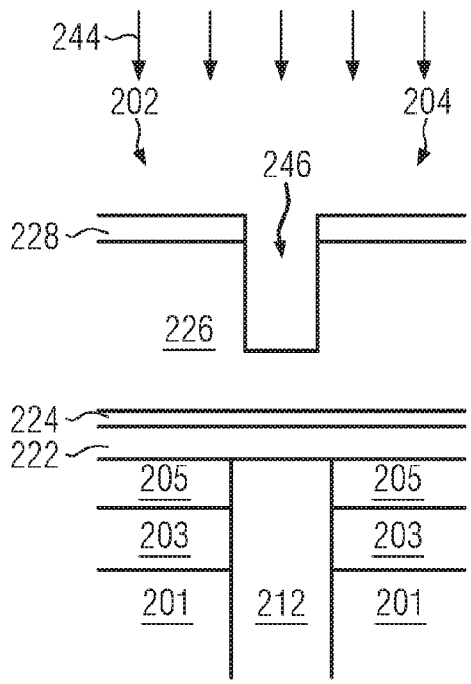
FIGS. 6a-6d schematically illustrate, in cross-sectional views, the fabrication at a more advanced stage during fabrication.
Figure 6B:
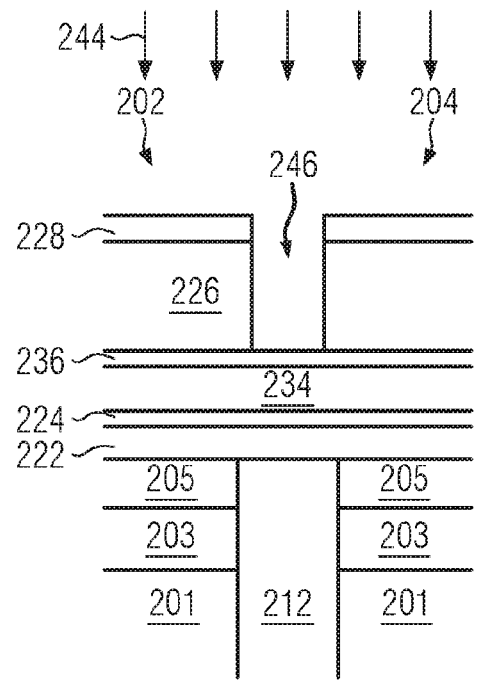
Figure 6C:
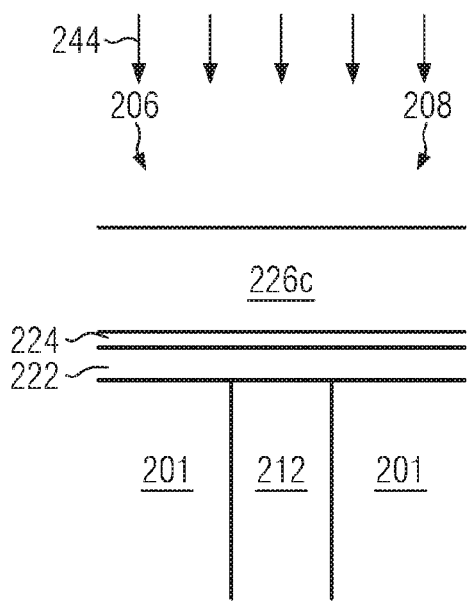
Figure 6D:
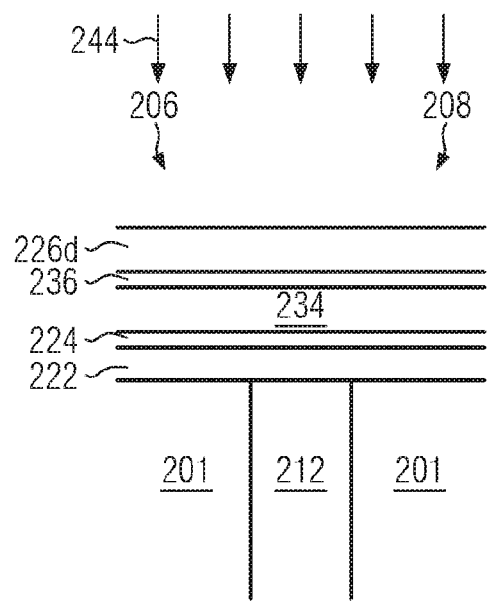

FIGS. 6a to 6d schematically illustrate, in cross-sectional views along the respective lines a-a, b-b, c-c and d-d in FIG. 2, the process flow at a more advanced stage during fabrication, when an etching process 244 is performed. In accordance with some illustrative embodiments of the present disclosure, the etching process 244 may remove the second gate structure masking pattern 232 leaving the patterned hard mask layer 228 over the active regions 202 and 204 and over the trench isolation structure 212 between the active regions 202 and 204 (FIGS. 6a and 6b). The etching process 244 may employ an etchant for etching the planarization layer 226 with end point detection when the further masking layer 236 or the masking layer 234 is exposed. Accordingly, a trench 246 extending into the planarization layer 226 in alignment with the patterned hard mask layer 228 may be formed (FIGS. 6a and 6b). With regard to the active regions 206 and 208, the planarization layer 226 may be partially etched back such that a remaining planarization material 226c may still be present in the active region 206, and a remaining planarization layer material 226d may still be present in the active region 208 (FIGS. 6c and 6d), the remaining planarization layer material 226d over the active region 208 covering the further mask layer 236 and the mask layer 234, respectively. A height of the remaining planarization layer material 226d on the active region 208 corresponds to a height difference between the SOI regions 202, 204 and the bulk regions 206, 208.

Figure 7A:
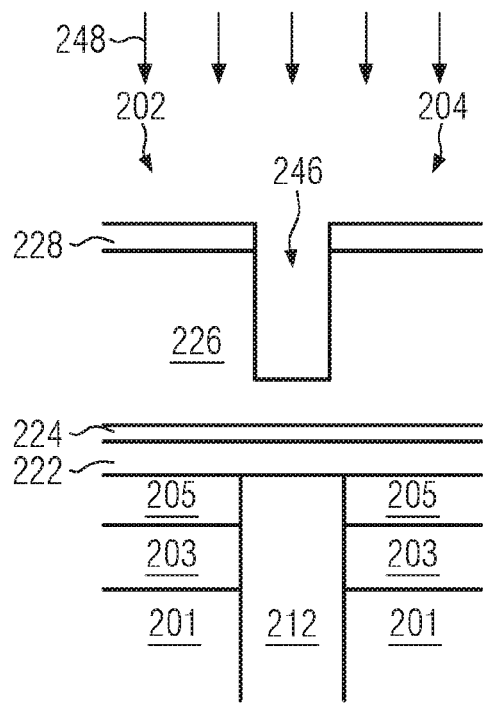
FIGS. 7a-7d schematically illustrate, in cross-sectional views, the fabrication at a more advanced stage during fabrication.
Figure 7B:
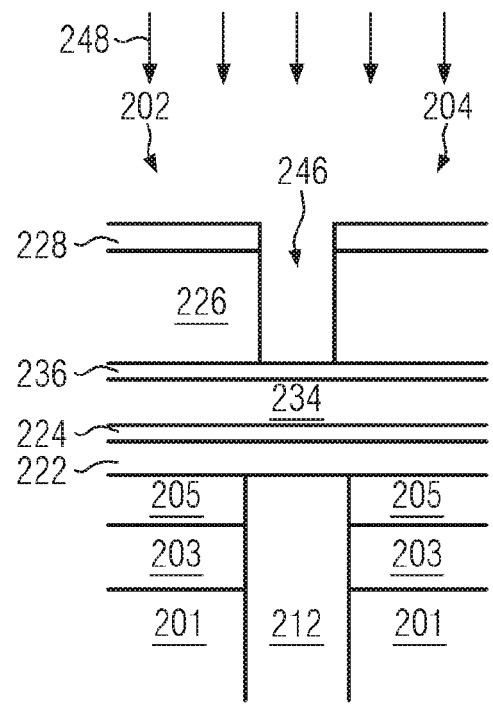
Figure 7C:
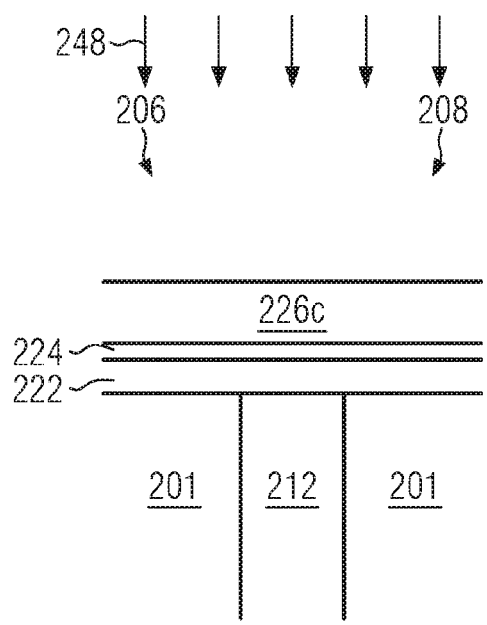
Figure 7D:
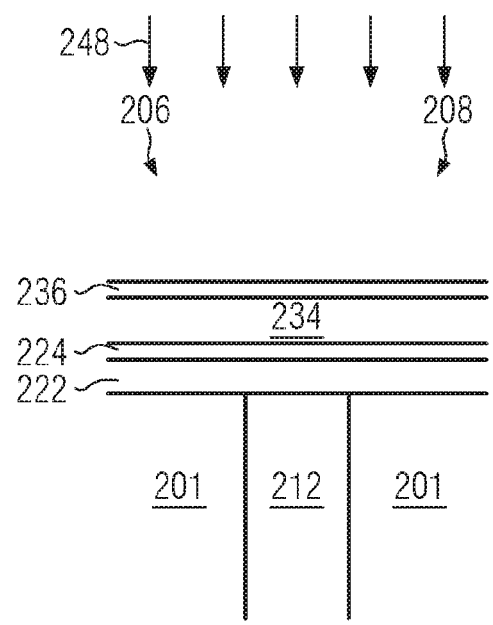

FIGS. 7a to 7d schematically illustrate, in cross-sectional views along the respective lines a-a, b-b, c-c and d-d in FIG. 2, the process flow at a more advanced stage during fabrication, when an etching process 248 is performed to selectively remove the remaining planarization layer material 226d over the active region 208 (FIG. 7d) and of the planarization layer 226 within the trenches 246 in alignment with the patterned hard mask layer 228 (FIG. 7a), while the remaining planarization layer 226 is partially removed from above the active region 206 (FIG. 7c). The etching process 248 may be highly selective with regard to the material of the masking layer 234 and the further masking layer 236, respectively. Furthermore, the etching process 248 may be highly selective with regard to the material of the gate material layer 222 and the insulating material 224, respectively.

Accordingly, the remaining planarization layer material 226d over the active region 208 may be reliably removed in alignment with the patterned hard mask layer 228 corresponding to the second gate structure masking pattern 232 (FIG. 3a). At this stage during processing, the planarization layer 226 covers the underlying insulating material layer 224 over the active regions 202, 204 in the cross section a-a of FIG. 2 (FIG. 7a), and the remaining planarization layer material 226c covers the underlying insulating material layer 224 over the active regions 206 and 208 in the cross section c-c of FIG. 2 (FIG. 7c).

Figure 8A:
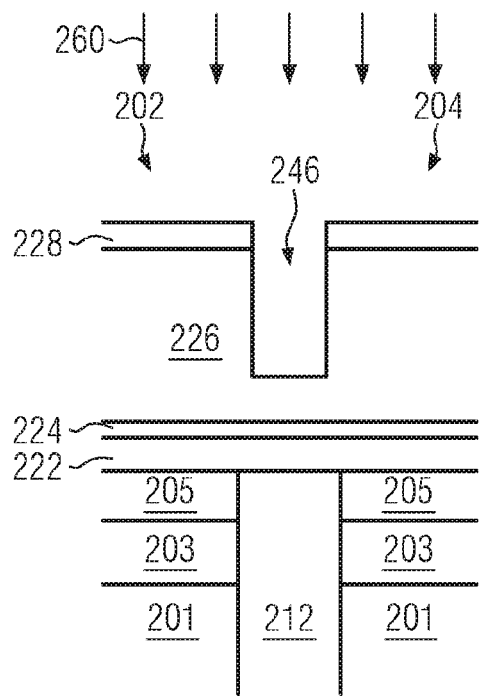
FIGS. 8a-8d schematically illustrate, in cross-sectional views, the fabrication at a more advanced stage during fabrication.
Figure 8B:
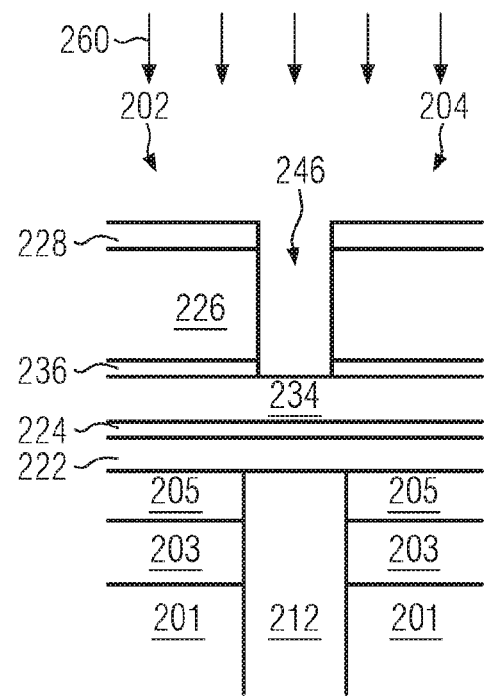
Figure 8C:
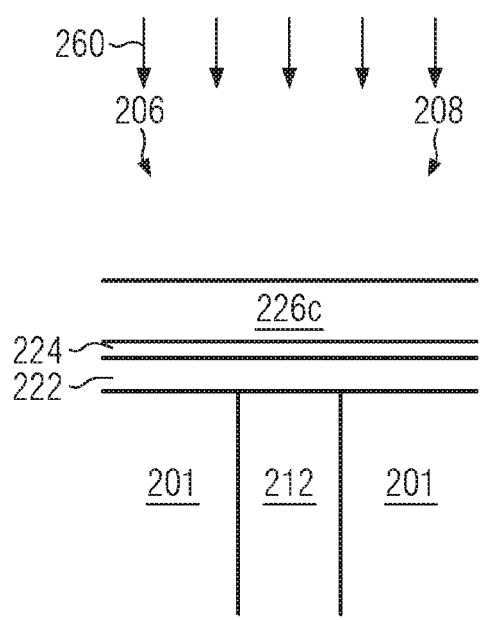
Figure 8D:
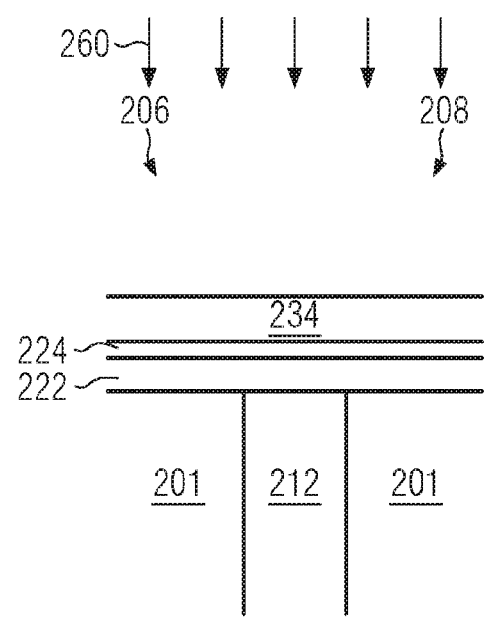

FIGS. 8a to 8d schematically illustrate, in cross-sectional views along the respective lines a-a, b-b, c-c and d-d in FIG. 2, the process flow at a more advanced stage during fabrication, when an etching process 260 is performed. Herein, the etching process may be performed to transfer the second gate structure masking pattern in accordance with the patterned hard mask layer 228 into the masking layer 236 in the active regions 202 and 204 of the cross section b-b of FIG. 2 (FIG. 8b), while removing the insulating material 224 from above the hard mask 234 over the active regions 206, 208 in the cross section d-d of FIG. 2 (FIG. 8d). The insulating material 224 over the gate material 222 may be protected from the etching process 260 in the active regions 202 and 204 in the cross section a-a of FIG. 2 (FIG. 8a) and in the active regions 206, 208 in the cross section c-c of FIG. 2 (FIG. 8c). That is, an upper surface portion of the gate material layer 222 may be protected over the active regions 202 to 208.

Figure 9A:
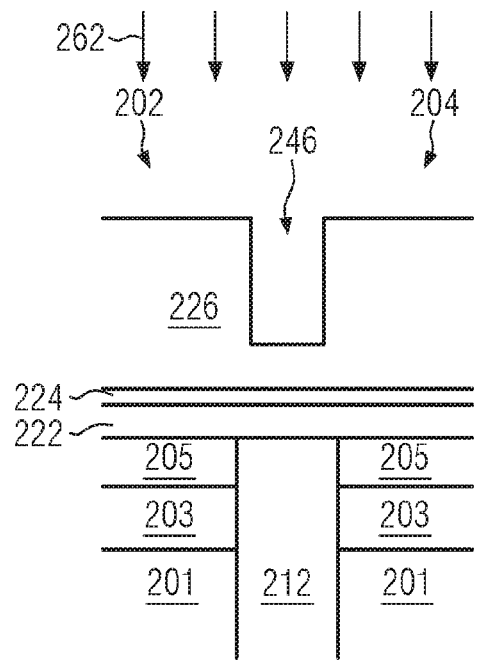
FIGS. 9a-9d schematically illustrate, in cross-sectional views, the fabrication at a more advanced stage during fabrication.
Figure 9B:
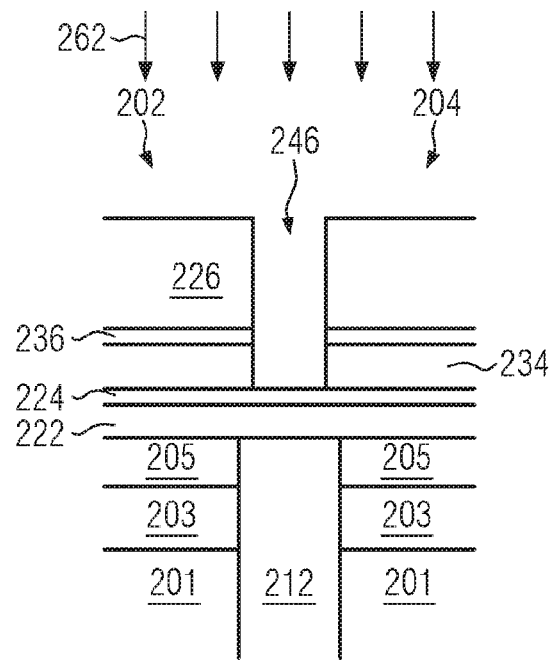
Figure 9C:
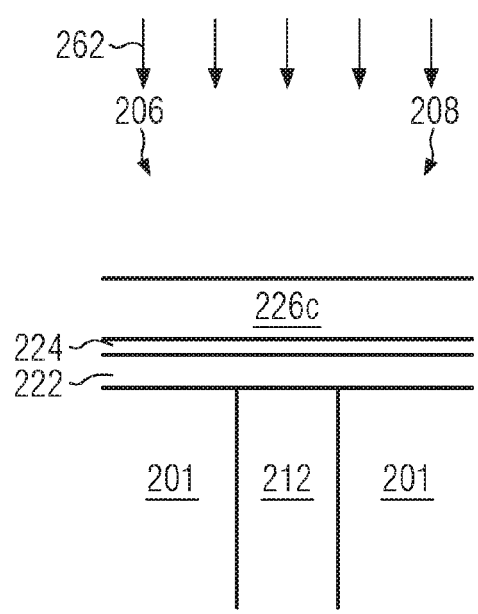
Figure 9D:
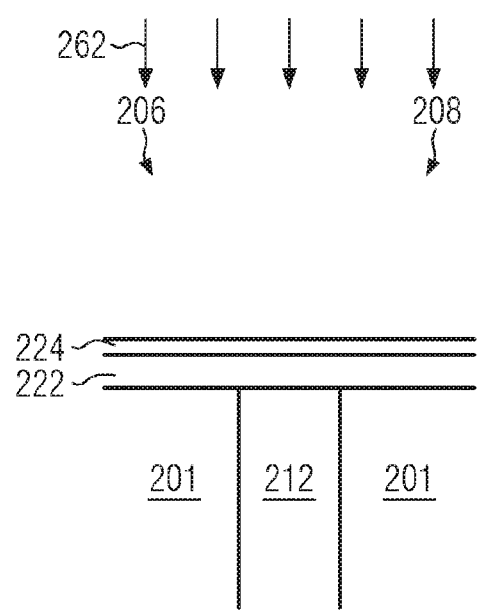

FIGS. 9a to 9d schematically illustrate, in cross-sectional views along respective ones of the lines a-a, b-b, c-c and d-d in FIG. 2, the process flow at a more advanced stage during fabrication, when an etching process 262 is performed. The etching process 262 may selectively remove the mask layer 234 and the patterned hard mask 228 over the active regions 202 and 204 in alignment with the patterned planarization layer 226 (FIGS. 9a and 9b). Furthermore, the etching process 262 may selectively remove the mask layer 234 over the active regions 206 and 208 in the cross section d-d of FIG. 2 (FIG. 9d), while leaving the insulating material 224 of the active regions in the cross section c-c of FIG. 2 protected by the remaining planarization layer material 226c (FIG. 9c). Accordingly, the insulating material 224 in the active regions 206 and 208 is exposed in the cross section d-d of FIG. 2 (FIG. 9d).

Figure 10A:
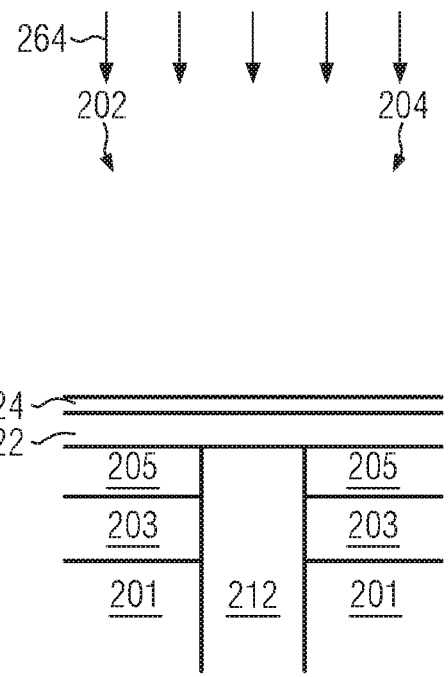
FIGS. 10a-10d schematically illustrate, in cross-sectional views, the fabrication at a more advanced stage during fabrication.
Figure 10B:
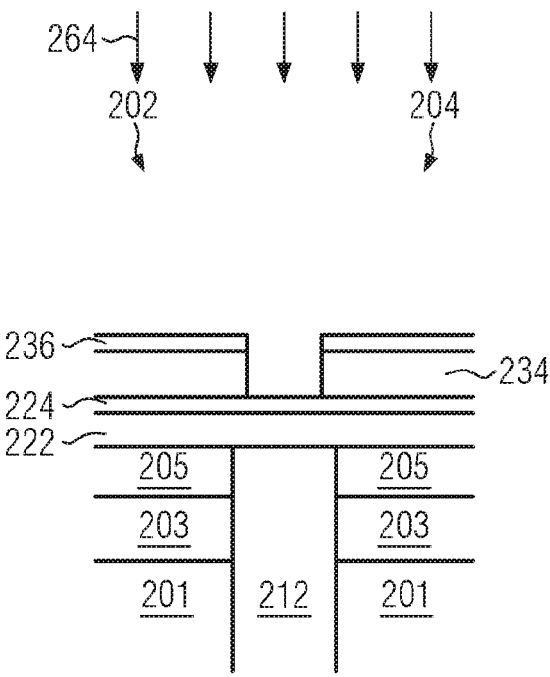
Figure 10C:
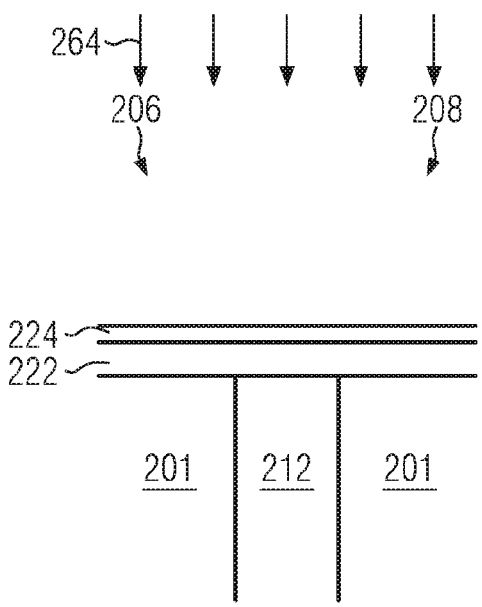
Figure 10D:
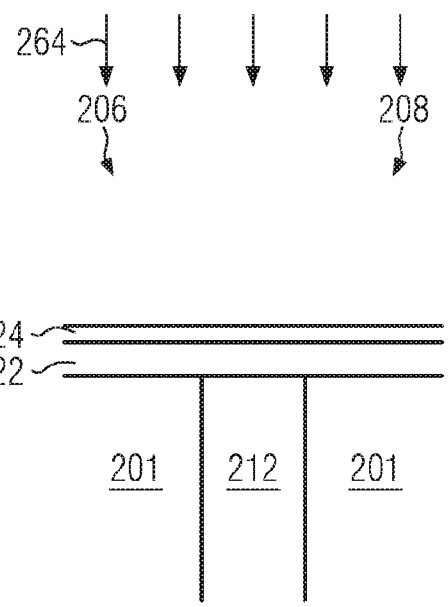

FIGS. 10a to 10d schematically illustrate, in cross-sectional views along respective ones of the lines a-a, b-b, c-c and d-d in FIG. 2, the process flow at a more advanced stage during fabrication when an etching process 264 is performed. The etching process 264 may remove the planarization layer 226 over the active regions 202 and 204 (FIGS. 10a and 10b), as well as the remaining planarization layer material 226c over the active regions 206 and 208 (FIG. 10c). Accordingly, the insulating material 224 may be exposed over the active regions 202 and 204 in the cross section a-a, c-c and d-d of FIG. 2 (FIGS. 10a, 10c, 10d), while partially exposing the insulating material 224 over the active regions 202 and 204 in the cross section b-b of FIG. 2 (FIG. 10b). Therefore, insulating material 224 may be patterned in accordance with the hard mask 236, 234 in the cross section b-b of FIG. 2 (FIG. 10b). The person skilled in the art will appreciate that, upon selecting a highly selective etching process 264 relative to the gate material layer 222, any excessive and unwanted loss of the gate material layer 222 may be avoided.

Accordingly, as depicted in FIGS. 10a and 10b, a cut of gate lines and/or a removal of gate lines over active regions where no gate lines are desired (e.g., over the active regions 206 and 208 in FIG. 2).

In accordance with some illustrative embodiments of the present disclosure, the insulating material 224 may be subsequently removed in a gate etch process (not illustrated), wherein cuts as indicated by lines 218 in FIG. 2 may be formed.

The person skilled in the art will appreciate that, in accordance with the etching processes 244 and 248 as depicted in FIGS. 6a to 6d and 7a to 7d, the planarization layer 226 may be partially removed in alignment with the patterned hard mask 228 without exposing any gate dielectric, that is, high-k material, and without exceedingly etching in the SOI regions which may adversely affect the fabrication. Furthermore, due to the etching process 248, critical dimensions may be reliably maintained as adverse effects from lateral etches may be avoided.

The person skilled in the art will appreciate after a complete reading of the present disclosure that, in accordance with some illustrative embodiments of the present disclosure, re-growth of semiconductor material on bulk areas of hybrid substrates may be avoided, while the patterning, particularly in SOI regions (e.g., FDSOI regions), may be performed without negatively effecting critical dimensions or increasing a potential risk for defects. In accordance with some illustrative, but not limiting, embodiments of the present disclosure, a patterning can be achieved by use of highly selective etches and/or upsizing of structures on SOI (e.g., FDSOI) regions and/or imposing appropriate rules for the use of certain mask sets over bulk areas.

After a complete reading of the present disclosure, the person skilled in the art will understand that the planarization layer 120 in FIGS. 1a to 1i may correspond to the first planarization layer as referred to above regarding the first aspect of the present disclosure.

After a complete reading of the present disclosure, the person skilled in the art will understand that the planarization layer 226 in FIGS. 3 to 10 may correspond to the second planarization layer as referred to above regarding the second aspect of the present disclosure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a gate structure over a hybrid substrate structure with topography having a bulk region and an SOI region, the method comprising:
    forming a gate material layer above said SOI and bulk regions;
    forming a mask layer above said gate material layer;
    forming a first planarization layer above said mask layer;
    forming a first gate structure masking pattern above said first planarization layer;
    patterning said first planarization layer in alignment with said first gate structure masking pattern; and
    patterning said mask layer in accordance with said patterned first planarization layer, resulting in a gate mask disposed above said gate material layer;
    wherein said patterning of said first planarization layer comprises:
        applying a first etching process to said first planarization layer, wherein said first etching process removes said first planarization layer over said SOI region so as to expose said mask layer over said SOI region while leaving said mask layer over said bulk region covered by remaining first planarization layer material over said bulk region; and
        applying a second etching process that removes said remaining first planarization layer material over said bulk region and exposes said mask layer over said SOI region.

2. The method of claim 1, wherein said first etching process is endpoint controlled and is stopped when exposing said mask layer over said SOI region.

3. The method of claim 1, wherein said second etching process is anisotropic and removes said remaining first planarization layer material in alignment with said first gate structure masking pattern selective to said mask layer.

4. The method of claim 1, further comprising forming an insulating material on said gate electrode material layer prior to forming said mask layer, said insulating material acting as an etch stop when patterning said mask layer.

5. The method of claim 1, wherein said first gate structure masking pattern comprises at least one first masking feature positioned above said SOI region and at least one second masking feature positioned above said bulk region, a width of said at least one first masking feature being greater than a width of said at least one second masking feature.

6. The method of claim 5, wherein said width of said at least one first masking feature is set based on a width of said at least one second masking feature and a lateral etching rate of said second etching process.

7. The method of claim 1, further comprising patterning said gate material layer in alignment with said gate mask.

8. The method of claim 1, further comprising:
    forming a second planarization layer above said gate mask disposed over said SOI and bulk regions;
    forming a second gate structure masking pattern above said second planarization layer, said second gate structure masking pattern being at least formed over said SOI region;
    patterning said second planarization layer in alignment with said second gate structure masking pattern; and
    patterning said gate mask in alignment with said patterned second planarization layer;

wherein said patterning said second planarization layer comprises:
  applying a third etching process to said second planarization layer in alignment with said second gate structure masking pattern, wherein said third etching process removes said second planarization layer over said SOI region so as to expose said mask layer positioned above said SOI region in alignment with said second gate structure masking pattern; and
  applying a fourth etching process that removes said planarization layer positioned above said SOI and bulk regions in alignment with said second gate structure masking pattern.

9. The method of claim 8, wherein said third etching process is endpoint controlled and is stopped when exposing said mask layer over said SOI region.

10. The method of claim 8, wherein said fourth etching process is anisotropic and is stopped when exposing said mask layer positioned above said bulk region, leaving said remaining second planarization layer material covering said SOI region having no said mask layer, and leaving said remaining second planarization layer material covering said bulk region having said mask layer.

11. The method of claim 8, further comprising forming an insulating material above said gate electrode material layer prior to forming said mask layer, said insulating material acting as an etch stop when patterning said gate mask.

12. The method of claim 8, further comprising patterning said gate material layer in alignment with said patterned gate mask positioned above said SOI and bulk regions.

13. The method of claim 8, wherein said second gate structure masking leaves said bulk region uncovered.

14. A method of forming a gate structure over a hybrid substrate structure with topography having a bulk region and an SOI region, the method comprising:
  forming a gate material layer above said SOI and bulk regions;
  forming a mask layer above said gate material layer;
  forming a first planarization layer above said mask layer;
  forming a first gate structure masking pattern above said first planarization layer;
  patterning said first planarization layer in alignment with said first gate structure masking pattern;
  patterning said mask layer in accordance with said patterned first planarization layer, resulting in a gate mask disposed above said gate material layer;
  forming a second planarization layer over said gate mask disposed above said SOI and bulk regions;
  forming a second gate structure masking pattern above said planarization layer, said second gate structure masking pattern being at least formed above said SOI region;
  patterning said second planarization layer in alignment with said second gate structure masking pattern; and
  patterning said gate mask in alignment with said patterned second planarization layer.

15. The method of claim 14, wherein said patterning said first planarization layer comprises:
  applying a first etching process that removes said first planarization layer positioned above said SOI region so as to expose said mask layer positioned above said SOI region while leaving said mask layer positioned above said bulk region covered by remaining first planarization layer material positioned above said bulk region; and
  applying a second etching process that removes said remaining first planarization layer material positioned above said bulk region and exposes said mask layer positioned above said bulk region.

16. The method of claim 15, wherein said first etching process is endpoint controlled and is stopped when exposing said mask layer positioned above said SOI region, and wherein said second etching process is anisotropic and removes said remaining first planarization layer material in alignment with said first gate structure masking pattern selective to said mask layer.

17. The method of claim 14, wherein said patterning said second planarization layer comprises:
  applying a third etching process that removes said second planarization layer positioned above said SOI region so as to expose said mask layer positioned above said SOI region in alignment with said second gate structure masking pattern; and
  applying a fourth etching process that exposes said mask layer over said bulk region.

18. The method of claim 17, wherein said third etching process is endpoint controlled and is stopped when exposing said mask layer positioned above said SOI region, and wherein said fourth etching process is anisotropic and is timed or endpoint controlled and stopped after exposing said mask layer positioned above said bulk region.

19. The method of claim 14, further comprising forming an insulating material above said gate electrode material layer prior to forming said mask layer, said insulating material acting as an etch stop when patterning said mask layer.

20. The method of claim 14, wherein said first gate structure masking pattern comprises at least one first masking feature positioned above said SOI region and at least one second masking feature positioned above said bulk region, a width of said at least one first masking feature being greater than a width of said at least one second masking feature.

* * * * *